(12) United States Patent
Gyenge et al.

(10) Patent No.: US 12,224,388 B2
(45) Date of Patent: Feb. 11, 2025

(54) COMPONENT ARRANGEMENT, PACKAGE AND PACKAGE ARRANGEMENT, AS WELL AS PRODUCTION METHOD

(71) Applicant: MSG Lithoglas GmbH, Dresden (DE)

(72) Inventors: Oliver Gyenge, Berlin (DE); Rachid Abdallah, Berlin (DE); Simon Maus, Berlin (DE); Ulli Hansen, Berlin (DE)

(73) Assignee: MSG LITHOGLAS GMBH, Dresden (DE)

( * ) Notice: Subject to any disclaimer, the term of this patent is extended or adjusted under 35 U.S.C. 154(b) by 896 days.

(21) Appl. No.: 16/967,759

(22) PCT Filed: Feb. 11, 2019

(86) PCT No.: PCT/DE2019/100130
§ 371 (c)(1),
(2) Date: Sep. 11, 2020

(87) PCT Pub. No.: WO2019/154465
PCT Pub. Date: Aug. 15, 2019

(65) Prior Publication Data
US 2022/0310890 A1    Sep. 29, 2022

(30) Foreign Application Priority Data
Feb. 9, 2018    (DE) .................... 10 2018 102 961.6

(51) Int. Cl.
*H01L 33/60* (2010.01)
*H01L 23/00* (2006.01)
(Continued)

(52) U.S. Cl.
CPC .......... *H01L 33/60* (2013.01); *H01L 31/0203* (2013.01); *H01L 31/02327* (2013.01);
(Continued)

(58) Field of Classification Search
CPC ... H01L 33/60; H01L 33/486; H01L 31/0203; H01L 5/4031; H01L 31/02327;
(Continued)

(56) References Cited

U.S. PATENT DOCUMENTS

| 7,177,331 B2 | 2/2007 | Yen et al. | |
| 2005/0062056 A1* | 3/2005 | Baugh | G02B 6/4292 |
| | | | 257/98 |

(Continued)

FOREIGN PATENT DOCUMENTS

| CN | 1599158 A | 3/2005 |
| CN | 102598288 A | 7/2012 |

(Continued)

OTHER PUBLICATIONS

International Preliminary Report on Patentability for PCT/DE2019/100130 issued Aug. 11, 2020.

(Continued)

*Primary Examiner* — Antonio B Crite
(74) *Attorney, Agent, or Firm* — Schmeiser, Olsen & Watts LLP

(57) ABSTRACT

Provided is a component arrangement, including a carrier substrate; a spacer which is arranged on the carrier substrate so as to surround an installation space and has an outlet opening on a side facing away from the carrier substrate; an optical component arranged in the installation space; a contact connection which electrically conductively connects the optical component to external contacts arranged outside the installation space; a cover substrate which is arranged on the spacer and with which the outlet opening is covered in a light-permeable manner; and a light-reflecting surface which is formed on an anisotropically etched silicon component and is arranged in the installation space as an inclined surface at an angle of approx. 45° relative to the surface of (Continued)

the carrier substrate facing the installation space, in such a way that light radiated in a horizontal direction onto the light-reflecting surface can be radiated out in the vertical direction through the opening and the cover substrate, and vice versa.

9 Claims, 11 Drawing Sheets

(51) Int. Cl.
    *H01L 31/02*     (2006.01)
    *H01L 31/0203*     (2014.01)
    *H01L 31/0232*     (2014.01)
    *H01L 33/48*     (2010.01)
    *H01L 33/62*     (2010.01)
    *H01S 5/02216*     (2021.01)
    *H01S 5/02255*     (2021.01)
    *H01S 5/02345*     (2021.01)
    *H01S 5/0237*     (2021.01)

(52) U.S. Cl.
    CPC ........ *H01L 33/486* (2013.01); *H01S 5/02216* (2013.01); *H01S 5/02255* (2021.01); *H01S 5/02345* (2021.01); *H01S 5/0237* (2021.01); *H01L 24/32* (2013.01); *H01L 24/48* (2013.01); *H01L 24/73* (2013.01); *H01L 31/02005* (2013.01); *H01L 33/62* (2013.01); *H01L 2224/32225* (2013.01); *H01L 2224/48091* (2013.01); *H01L 2224/48227* (2013.01); *H01L 2224/73265* (2013.01); *H01L 2933/0058* (2013.01)

(58) Field of Classification Search
    CPC ............ H01S 5/02255; H01S 5/02216; H01S 31/0203; H01S 5/4031; H10S 5/02208; H10S 5/02255; H10S 5/4031
    See application file for complete search history.

(56) References Cited

U.S. PATENT DOCUMENTS

| | | | |
|---|---|---|---|
| 2011/0158273 A1* | 6/2011 | Okayama | H01S 5/02208 372/43.01 |
| 2014/0363120 A1 | 12/2014 | Stephens et al. | |
| 2017/0033528 A1* | 2/2017 | Tanisaka | H01S 5/02326 |
| 2020/0303594 A1* | 9/2020 | Sorg | H01L 33/52 |
| 2020/0303596 A1* | 9/2020 | Lim | H01L 33/60 |

FOREIGN PATENT DOCUMENTS

| | | |
|---|---|---|
| JP | 2001-111159 A | 4/2001 |
| JP | 2003298168 A | 10/2003 |
| JP | 2011-138953 A | 7/2011 |
| JP | 2013-506275 A | 2/2013 |
| WO | 2011035783 A1 | 3/2011 |
| WO | 2016055520 A1 | 4/2016 |
| WO | 2017149573 A1 | 9/2017 |

OTHER PUBLICATIONS

Written Opinion for PCT/DE2019/100130 issued Jun. 6, 2019.
International Search Report issued Jun. 6, 2019 for PCT/DE2019/100130.

* cited by examiner

COMPONENT ARRANGEMENT, PACKAGE AND PACKAGE ARRANGEMENT, AS WELL AS PRODUCTION METHOD

CROSS-REFERENCE TO RELATED APPLICATIONS

This application claims priority to PCT Application No. PCT/DE2019/100130, having a filing date of Feb. 11, 2019, based on German Application No. 10 2018 102 961.6, having a filing date of Feb. 9, 2018, the entire contents both of which are hereby incorporated by reference.

FIELD OF TECHNOLOGY

The following relates to a component arrangement, a package and a package arrangement, as well as production methods.

BACKGROUND

In connection with component arrangements, it is known to arrange components, for example, optical components that emit or absorb light, in a housing. The component arrangement can be used to produce a package.

A method for manufacturing such a component arrangement is known from the document WO 2011/035783 A1, for example. A spacer is arranged on a carrier substrate in such a way that the spacer surrounds an installation space in which a component is arranged. The installation space is closed by placing a cover substrate on the spacer. With the cover substrate, a light-permeable outlet opening can be provided, through which light can be emitted or received. Wall surfaces of the spacer facing the installation space can be provided with a metallization in order to provide a light-reflecting mirror coating.

Document WO 2016/055520 A1 describes how to produce a package for a laser component with a housing comprising a carrier having a cavity with a bottom surface and a side wall. The cavity widens starting from the bottom surface. In the cavity, a laser chip is arranged on the bottom surface and its emission direction is oriented parallel to the bottom surface. A reflective element is also arranged in the cavity, which reflective element rests on an edge between the bottom surface and the side wall. A reflective surface of the reflective element forms an angle of 45 degrees with the bottom surface of the cavity. The direction of emission also encloses an angle of 45 degrees with the reflective surface of the reflective element.

A component arrangement is also known from document WO 2017/149573 A1.

In document U.S. Pat. No. 7,177,331 B2, a laser diode is installed in what is known as a TO housing.

SUMMARY

An aspect relates to a component arrangement, a package, as well as a package arrangement and production methods, with which an improved light conduction or deflection of light beams is provided in an installation space with an optical component.

According to one aspect, a component arrangement is provided that has the following: a carrier substrate; a spacer which is arranged on the carrier substrate so as to surround an installation space and has an outlet opening on a side facing away from the carrier substrate; an optical component arranged in the installation space; a contact connection which electrically conductively connects the optical component to external contacts arranged outside the installation space; a cover substrate which is arranged on the spacer and with which the outlet opening is covered in a light-permeable manner; and a light-reflecting surface which is formed on an anisotropically etched silicon component and is arranged in the installation space as an inclined surface at an angle of approximately 45 degrees relative to the surface of the carrier substrate facing the installation space, in such a way that light radiated in a horizontal direction onto the light-reflecting surface can be radiated out in the vertical direction through the opening and the cover substrate, and vice versa.

According to further aspects, a package with a component arrangement and a housing, in which the component arrangement is accommodated, as well as a package arrangement having a flat arrangement of a plurality of packages are provided.

Another aspect relates to a method for producing a component arrangement having the following steps: producing an anisotropically etched silicon component from a silicon single crystal by anisotropic etching, wherein the silicon single crystal is tilted by approximately 9.7 degrees relative to the 100 crystal orientation such that a 111 crystal plane with a slope of approximately 45 degrees is formed; and producing a component arrangement using the anisotropically etched silicon component, wherein a light-reflecting surface is formed in the component arrangement with the 111 crystal plane with the slope of approximately 45 degrees.

According to additional aspects, a method for producing a package as well as a method for producing a package arrangement are provided, wherein the package/package arrangement is produced in the panel, for example by wafer-level packaging.

With the help of the proposed technology, it is possible to deflect light beams running in a horizontal direction in the installation space provided in the component arrangement at the light-reflecting surface inclined at approximately 45 degrees to the horizontal direction, and vice versa. Light emitted by the optical component can thus be deflected from the horizontal direction to the vertical direction in order to emit the light rays through the outlet opening. Conversely, light incident in the vertical direction through the outlet opening can be deflected at the light-reflecting surface in the horizontal direction. The light-reflecting surface is provided with the anisotropically etched silicon component as the surface of this silicon component.

The optical component can be designed as a light-emitting or light-absorbing component, for example as a light-emitting diode or light-absorbing photodiode, for example an avalanche photodiode or laser diode.

The light-emitting component can be designed to emit light beams in a directed and bundled form, for example in the form of substantially directed laser radiation with centric emission of the intensity maximum with optional beam divergence (beam widening).

The proposed technology makes it possible to arrange the optical component in the installation space in such a way that the exit of the emitted light beams or the entry of the received light beams can take place in a vertical direction. In order to emit light rays in a vertical direction (with respect to the surface of the carrier substrate), it is not necessary, in contrast to the conventional art, to arrange the optical component in an upright position in the installation space, as provided for in the conventional art (see, for example, U.S. Pat. No. 7,177,331 B2). With the help of the proposed technology, the overall height of the component arrangement can be reduced and the assembly can be simplified.

The contact connection can have a feedthrough connection through the carrier substrate, wherein the external contacts can be arranged on the underside of the carrier substrate.

A contact connection can be provided which is led laterally out of the installation space, for example on the surface of the carrier substrate facing the installation space, in particular in such a way that the laterally led-out contact connection is formed by passing through between carrier substrate and spacer. The contact connection can comprise a plurality of individual contact connections.

A contact surface of the anisotropically etched silicon component can be substantially parallel to the surface of the carrier substrate facing the installation space. In this embodiment, the light-reflecting surface is inclined at an angle of approximately 45 degrees to the contact surface.

The anisotropically etched silicon component can be arranged in the installation space surrounded by the spacer. Here, the anisotropically etched silicon component, on which the light-reflecting surface is provided, can be arranged in the installation space separately and at a distance from the spacer, for example in such a way that there is no contact between the anisotropically etched silicon component and the spacer which surrounds the installation space.

The spacer can be at least partially formed with the anisotropically etched silicon component. In this embodiment, the anisotropically etched component forms the spacer partially or completely. In one embodiment, it can be provided that the spacer surrounding the installation space is formed completely from the anisotropically etched silicon component around the installation space, for example as a one-piece anisotropically etched silicon component. In the various embodiments, an inner wall surface of the spacer facing the installation space has an inclination of approximately 45 degrees, at least in the region of the light-reflecting surface. In the case of these or other embodiments, the spacer can be formed as a one-piece frame that surrounds the installation space in a continuous manner.

A first wall surface of the spacer facing the installation space and arranged outside a region with the light-reflecting surface can be inclined relative to the vertical direction at a first angle different from 45 degrees. While the wall surface of the spacer facing the installation space has an inclination of approximately 45 degrees in the region of the light-reflecting surface, the first wall surface outside the region with the light-reflecting surface is inclined at an angle different therefrom, for example approximately 64.5 degrees. The first wall surface of the spacer can be arranged opposite the light-reflecting surface.

A second wall surface of the spacer, different from the first one, facing the installation space and arranged outside the region with the light-reflecting surface, can be inclined relative to the vertical direction at a second angle different from 45 degrees, which is different from the first angle. The first and/or the second wall surface, which have an angle of inclination different from 45 degrees, can be arranged in a portion of the spacer formed by the anisotropically etched silicon component, or outside such a portion. For example, the second angle can be approximately 55.3 degrees. The second wall surface can be arranged in a portion of the spacer adjacent to the light-reflecting surface and/or the first wall surface. Wall surfaces opposite one another can be formed with the second angle of inclination. Alternatively, the wall surfaces differing from 45 degrees can also be designed with other angles.

The spacer can be formed by the anisotropically etched silicon component as a one-piece or multi-piece frame, which completely surrounds the installation space in a continuous manner. In a plan view, the frame can have substantially a trapezoidal shape, either in the region of an upper and/or a lower opening of the passage which is surrounded by the frame. If the upper and lower openings each have a substantially trapezoidal shape, edges of the upper and lower openings can run parallel to each other in pairs, either on one or more sides of the passage, in particular also on all sides. The trapezoidal shape in one embodiment can be formed not over the entire width of the passage, but substantially over a width of less than ⅓ of the total width of the passage.

The opening angles (in corner regions of the passage) on the side with the 45-degree mirror plane can each be approximately 83.2 degrees. On the opposite side, the angles are approximately 96.8 degrees each. A design can be provided in which a plurality of openings of this type are provided in the anisotropically etched silicon component, each of which has a separately formed installation space for accommodating one or more optical components.

The cover substrate can at least partially fill the installation space. The cover substrate can fill the installation space partially or completely. For example, epoxy resin or silicone can be introduced into the installation space as cover substrate. Alternatively, the installation space is free of the cover substrate, and the installation space can be designed as a hollow space in which the optical component is located. In embodiments, a portion of the hollow space below the outlet opening can be free of the cover substrate.

The light-reflecting surface can have a surface-side reflective coating. The surface-side reflective coating can be produced, for example, by a metallization or a dielectric mirror.

The optical component can have a lateral optical outlet/inlet, through which light can exit/enter in a horizontal direction. Incident or outgoing light rays are deflected at the light-reflecting surface in such a way that a deflection between horizontal and vertical direction, or vice versa, takes place. If the optical component is designed as a light-emitting diode, the emitted light beams exit through a lateral optical outlet. If the optical component is designed as a photodiode, the incident light rays enter in the horizontal direction through a lateral optical inlet, for example an entry window.

The optical component can be arranged on a submount, which is arranged on the carrier substrate. The submount can be made of silicon carbide or aluminum nitride, for example.

In the method for producing the component arrangement, it can be provided to produce the anisotropically etched silicon component by wet chemical etching, for example by etching with potassium hydroxide solution (KOH). Another suitable etching solution for the anisotropic etching of silicon is, for example, tetramethylammonium hydroxide (TMAH).

For producing the package and/or for producing the package arrangement, it can be provided to use the packaging in a panel or at wafer level for this purpose.

In the case of production using wafer-level processes, one or more circumferential silicon frames, entire cap substrates and/or a single or multiple elements with a reflective surface inclined by 45 degrees can be produced at wafer level. The advantage is that many components/caps can be produced simultaneously at wafer level. The individual caps for the packaging are produced after separation, for example by sawing the cap substrate. The component can be packaged by applying a separated cap to a board on which a chip or component is pre-assembled. The components can also be pre-assembled in a panel, i.e. a plurality of components are already mounted on a carrier substrate and are then packaged by applying single caps or cap arrays (separated panels with a plurality of cap structures from a cap substrate produced at wafer level). Wafer-level packaging in the meaning used here then refers to packing (packaging) all components on a wafer in one step with a cover substrate in wafer form. For example, this can be the case if components are completely pre-assembled on a through-plated substrate, for example a silicon substrate in wafer form, and then all components are packaged at the same time by the bonding on of a cap wafer. Individual packages are then provided by subsequent separation of the composite.

In connection with the package, it can be provided that, with respect to the housing in which the component arrangement is accommodated, as viewed from the top side of the housing, light exits or enters substantially centrally in the region of the outlet opening/inlet opening. In this way, a substantially central light emission/light absorption is realized for the package. The cover substrate can, for example, consist of borosilicate glass such as Bofofloat33 or Mempax from Schott AG, quartz glass, sapphire glass or also other glasses such as AF32, D263T, BK7 or B270 from Schott AG; Eagle XG or Pyrex from Corning; SD2 from Hoya or also EN-A1 from Asahi. The cover substrate, however, can also be made of silicon or germanium, for example for applications in the IR range. The cover substrate can additionally have a substrate coating, for example an anti-reflection coating. The coatings can be designed for different wavelength ranges and can be provided on one or both sides. Filter coatings and/or opaque aperture structures for different wavelength ranges can also be provided.

In addition, in one embodiment, the integration of optical elements can be provided, for example lenses on the cover substrate. Here, for example, convex lenses made of polymer, glass-like materials, silicon or germanium can be considered. The use of microstructured Fresnel lenses is also possible.

One or more through contacts is/are provided in the carrier substrate for the electrical contact of the optical component. The contacts on the rear side allow the later assembly in SMD construction, for example by tin/silver wave soldering or assembly with electrically conductive adhesives.

The carrier substrate can consist, for example, of silicon, ceramics such as aluminum nitride, silicon carbide, aluminum oxide, LTTC ceramics (Low Temperature Cofired Ceramics) or HTCC ceramics (High Temperature Cofired Ceramics), glass or DBC (Direct Bonded Copper) substrates. Furthermore, the use of metal substrates, for example IMS (Insulated Metal Substrates) made of copper, aluminum or other metals, can be provided. The use of carrier substrates made of plastics such as FR4 is also conceivable.

A connection between spacer and carrier substrate can be made, for example, by a solder bond, for example via a eutectic bond. For this purpose, a metal combination in a eutectic composition is applied to the carrier substrate or the rear side of the spacer, for example gold and tin, copper and tin, gold and germanium, tin and silver, gold and indium, copper and silver, or gold and silicon, and forms a eutectic joining phase in a soldering process and connects the spacer to the carrier substrate. The spacer and carrier substrate are provided with an appropriate base metallization for the soldering process. The metal combination for eutectic joining can be provided as a preform, for example. Alternatively, the metal combination can be applied as a paste or galvanically to one of the joining partners.

It can be provided to arrange what is known as an alloy stop under the actual joining phase, for example in the case of thin metal layers. For example, layers of platinum or nickel or alloys of chrome and nickel are thus suitable for the eutectic joining of gold and tin.

By using very high surface qualities of $Ra<1$ nm, a direct bonding method can also be used. This can be a direct fusion bond, which is hydrophobic or hydrophilic in relation to the surface nature of the bond partners. The two bond partners are first connected to one another by van der Waals bonds via a pre-bond. In a subsequent annealing step, covalent bonds are then formed in the bond interface. The fusion bond can also be plasma-activated. This makes it possible to significantly reduce the temperature load during annealing. An anodic bonding can be provided as a further direct bonding method.

As an alternative to the described methods, a reactive bonding process can also be used. In a reactive bond, a metal stack of alternating layers is applied. This metal stack can be provided, for example, by deposition processes such as sputtering or in the form of films. An electrical or laser-induced pulse leads to a short-term generation of a high-thermal reaction that "welds" the two bond partners together. The metal layers are bilayer periods, for example, of palladium and aluminum or of copper oxide and aluminum.

In addition, solid-liquid interdiffusion bonding can be used, for example from metal combinations of gold and indium, gold and tin or copper and tin. In this method, the bonding process is determined during an annealing step by the diffusion of one bonding partner into the other. The actual joining phase then resists higher temperatures later. Furthermore, permanent connections can be made by joining, for example, gold with gold, copper with copper or aluminum with aluminum by (for example) thermal compression bonding. Glass frit bonding can also be provided.

In the case of transparent substrates, a laser welding method can be used to connect the carrier substrate and spacer if the surface quality of the joining surfaces is adequate. It is also conceivable to use epoxy resins, silicones or other adhesives.

For example, a direct bonding method can be used to connect the spacer and the cover substrate. Such methods are, for example, anodic bonding or fusion bonding. Reactive bonding or adhesive bonding can also be used. Furthermore, solid-liquid interdiffusion bonding can also be used here. Laser welding is also suitable for joining the spacer and cover substrate. Here, two substrates are brought into "optical contact" and then welded together using a laser. It is conceivable to use all the above-mentioned joining methods for the spacer and carrier substrate also for joining the spacer and cover substrate.

The embodiments described in conjunction with the component arrangement can be provided accordingly in conjunction with the method for producing the component arrangement.

BRIEF DESCRIPTION

Some of the embodiments will be described in detail, with references to the following Figures, wherein like designations denote like members, wherein.

Figure 20:
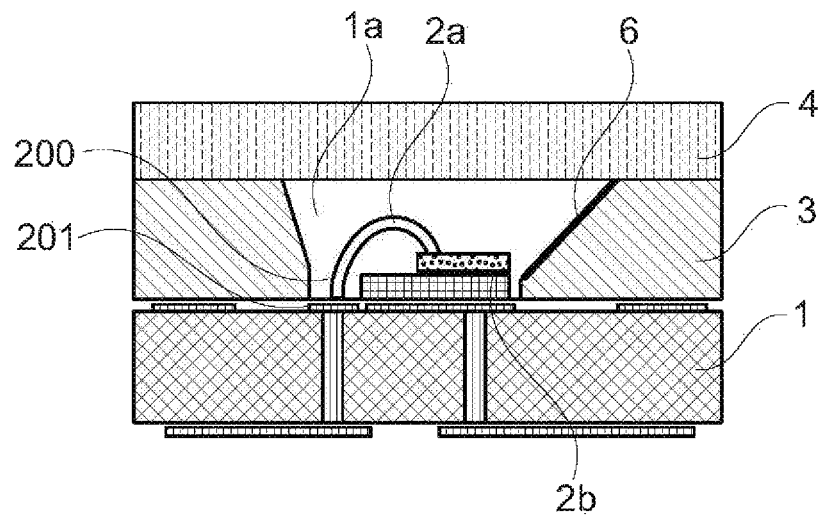
Figure 21:
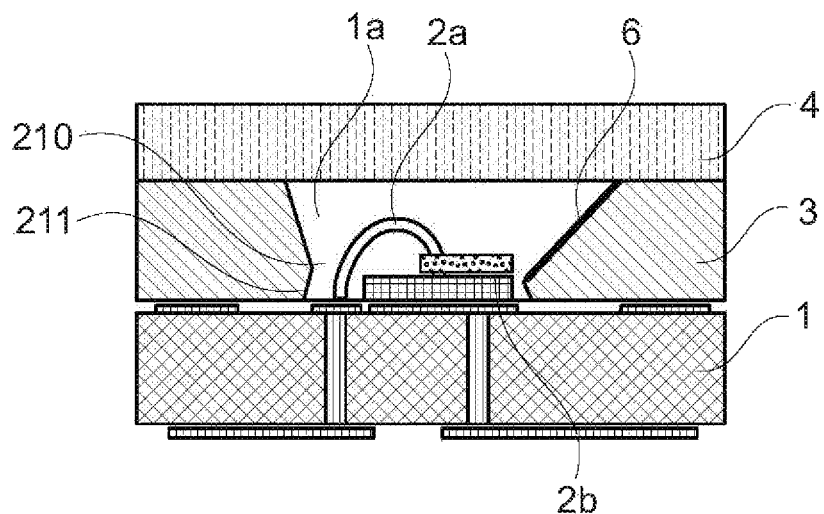

FIG. 20 shows a schematic representation of a component arrangement in which a lower opening in the spacer, which is designed as an anisotropically etched silicon component, is designed with an almost vertical chamfer; and FIG. 21 shows a schematic representation of a component arrangement in which a lower opening in the spacer, which is designed as an anisotropically etched silicon component, is designed with an undercut relative to the surface of the spacer.

DETAILED DESCRIPTION

Figure 1:
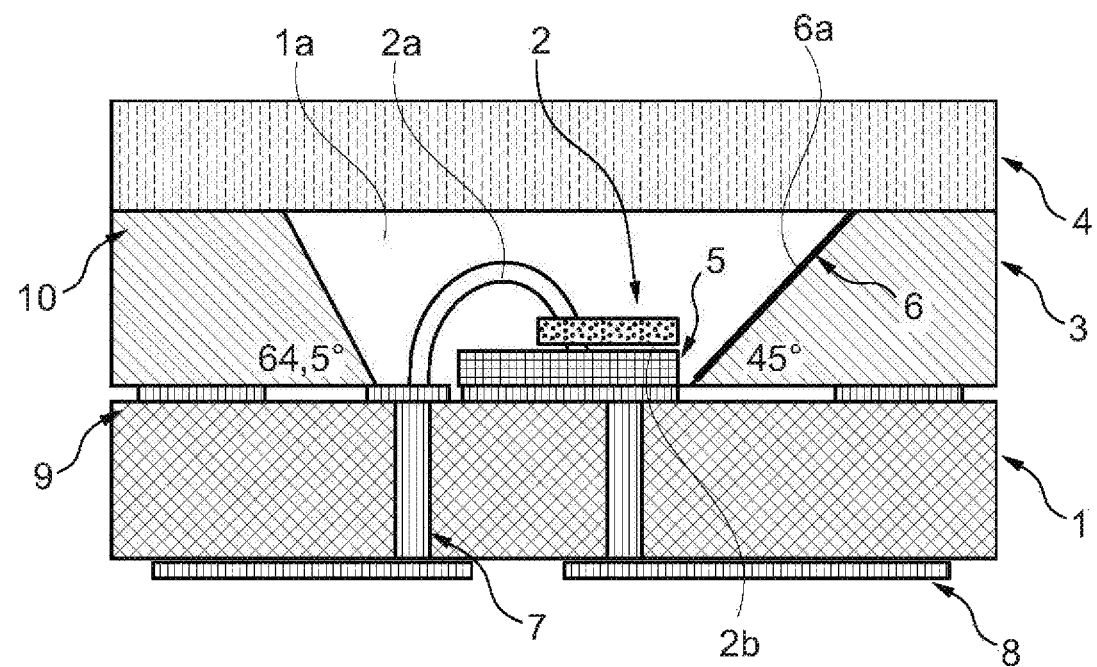
FIG. 1 shows a component arrangement in which an optical component is arranged in an installation space and is connected to external contacts via a contact connection through a carrier substrate.

FIG. 1 shows a component arrangement in which an optical component 2 is arranged on a carrier substrate 1 in an installation space 1a. The optical component 2 is, for example, a light-emitting or light-receiving diode, for example, a laser diode or a photodiode. A spacer 3 is provided, which consists of silicon. A cover substrate 4 is arranged on the spacer 3.

The optical component 2 is mounted on a submount 5 in the exemplary embodiment, for example a submount made of silicon carbide or aluminum nitride. Alternatively, the optical component 2 can be arranged directly on the carrier substrate 1. The optical component 2 is mounted on the submount 5 or directly on the carrier substrate 1 by eutectic soldering, for example of gold and tin. However, other processes such as gold or indium bonding or sintered bonding can also be used. The chip can be mounted either by a flip-chip process, by contacting with wire bonds or a ground contact in combination with wire bonds.

The silicon spacer 3 is produced by anisotropic KOH etching from a silicon single crystal inclined by approximately 9.7 degrees to the 100 crystal orientation (off-oriented). As a result, a 111 crystal plane is formed, which has a slope 6 at an angle of approximately 45 degrees to the surface. The opposite plane then forms at an angle of approximately 64.5 degrees. The crystal planes at the side can have an angle of approximately 55.3 degrees, for example.

The spacer 3, which is designed as an anisotropically etched silicon component, has a metallic mirror coating 6a in the embodiment shown. Alternatively, another optical (light-reflecting) layer can be provided, for example a dielectric mirror for certain wavelengths. For the optional metallic mirror coating 6a, aluminum is used in the UV range, silver in the visible range, and gold in the IR/NIR range. A metallic copper mirror coating is advantageous from the "red" wavelength range (wavelengths greater than about 600 nm). Alternatively, the sloping side walls in a cavity can also be provided with different coatings. For example, the side walls that differ from 45 degrees can be provided with a particularly opaque/light-absorbing layer for the desired wavelength range in order to avoid reflections in the installation space.

The naturally grown monocrystalline 111 planes (light-reflecting surfaces/mirror surfaces) inclined at 45 degrees and produced by the wet chemical etching process described above are very smooth compared to other production methods, such as machining or dry etching methods. This results in a deflection of the beam with very low scattering and low loss.

The optical component 2 mounted on the carrier substrate 1 can be a side-emitting component, for example a laser diode. The slope 6 of 45 degrees enables light exiting laterally horizontally from optical component 2 to be emitted vertically by appropriate deflection.

The cover substrate 4 can, for example, consist of borosilicate glass such as Borofloat33 or Mempax from Schott AG, quartz glass, sapphire glass or also other glasses such as AF32, D263T, BK7 or B270 from Schott AG; Eagle XG or Pyrex from Corning; SD2 from Hoya; or EN-A1 from Asahi. The cover substrate 4 can also consist of silicon or germanium, for example for applications in the IR range. The cover substrate 4 can additionally have a substrate coating, for example an anti-reflection or a filter coating. The coatings can be designed for different wavelength ranges, one-sided or double-sided and, if necessary, structured. Opaque structured coatings can also be used for the wavelength ranges in order to form apertures, for example.

In addition, the integration of optical elements can be provided in one embodiment, for example, lenses on the cover substrate 4. For example, convex lenses made of polymer, glasses or other glass-like materials, silicon or germanium (see FIG. 18) can be considered here. The use of microstructured Fresnel lenses is also possible.

In the carrier substrate 1, through contacts 7, connected to one or more bonding connections 2a, are provided for the electrical contact of the optical component 2. In addition to the bonding connection 2a in this embodiment, a ground contact 2b is provided, which is also connected to a through contact 7. The contacts 8 on the rear side enable later mounting in SMD construction, for example by tin-silver wave soldering.

The carrier substrate 1 can, for example, consist of silicon, ceramics such as aluminum nitride, silicon carbide, aluminum oxide, LTTC ceramics (Low Temperature Cofired Ceramics) or HTCC ceramics (High Temperature Cofired Ceramics), glass or DBC (Direct Bonded Copper) substrates. Furthermore, the use of metal substrates, for example IMS (Insulated Metal Substrates) made of copper, aluminum or other metals, can be provided. The use of carrier substrates made of plastics such as FR4 is also conceivable.

A connection 9 between the spacer 3 and carrier substrate 1 can be made, for example, by a solder bond, for example by a eutectic bond. For this purpose, a metal combination with an appropriate eutectic composition, such as gold and tin, copper and tin, gold and germanium, tin and silver, gold and indium, copper and silver, tin with silver and copper or gold and silicon, is applied to the carrier substrate 1 or the rear side of the spacer 3. This forms a eutectic joining phase between the spacer 3 and carrier substrate 1 in the later soldering process. In order to achieve a layer adhesion of the metal combinations on the carrier substrate 1 or the spacer 3 as good as possible, a layer of pure titanium, tungsten titanium or also tungsten titanium nitride can be arranged underneath the applied metal stack. The latter has the advantage of providing a diffusion barrier with respect to gold. The bonding partner must be provided with a counter metallization for the joining process in order to ensure good wetting of the joining phase that forms during the soldering process.

In principle, solders containing lead can also be used for joining the carrier substrate 1 and the spacer 3. A sintering process such as silver or gold sintering can be provided as a further method for joining.

In addition, it can be provided, for example with thin metal layers, to place what is known as an alloy stop beneath the actual joining phase. In the case of eutectic bonding with gold and tin, for example, layers of platinum, nickel or alloys of chromium and nickel are suitable for this purpose.

By using very high surface qualities of Ra<1 nm, a direct bonding method can also be used. This can be a direct fusion bond, which is hydrophobic or hydrophilic in relation to the surface nature of the bond partners. The two bond partners are first connected to one another by van der Waals bonds via a pre-bond. In a subsequent annealing step, covalent bonds are then formed in the bond interface. The fusion bond can also be plasma-activated. This makes it possible to significantly reduce the temperature load during the annealing. An anodic boding can also be provided as a further direct bonding method. The advantage of the latter method is that the surface quality requirements of the bond partners are less demanding compared to fusion bonding.

As an alternative to the described methods, a reactive bonding process can also be used. In reactive bonding, a metal stack of alternating metallic layers is applied. An electrical or laser-induced pulse leads to a short-term, high-thermal reaction that "welds" the two bond partners together. The metal layers are bilayer periods, for example made of palladium and aluminum or made of copper oxide and aluminum. In addition, solid-liquid interdiffusion bonding, for example with metal combinations of gold and indium, gold and tin or copper and tin is also possible. In this method, the bonding process is determined during an annealing step by the diffusion of one bonding partner into the other. The actual connection phase then resists higher temperatures later on. Alternatively, glass-frit bonding can also be provided.

For example, a direct bonding method can be used for the connection 10 of the spacer 3 and cover substrate 4. Such methods are, for example, anodic bonding or fusion bonding. In the case of an anodic bond, the direct joining of silicon to the cover substrate made of an alkaline glass can be provided. Alternatively, the anodic joining of aluminum to the cover substrate made of an alkaline glass is also possible. In this case, the mirroring on the 45-degree mirror surface is not structured, i.e., the top side of the silicon spacer is completely coated with aluminum.

Reactive bonding or adhesive bonding can also be used. In addition, solid-liquid interdiffusion bonding is also possible here. Laser welding is additionally suitable for joining the spacer and the cover substrate. Here, two substrates are brought into an "optical contact" and then welded together using a laser. The joining of spacer and cover substrate can also be realized as a thermocompression bond, for example, of the metal combinations gold with gold, copper with copper or aluminum with aluminum.

Depending on the bonding method, the housing is hermetic or quasi-hermetic.

Figure 2:
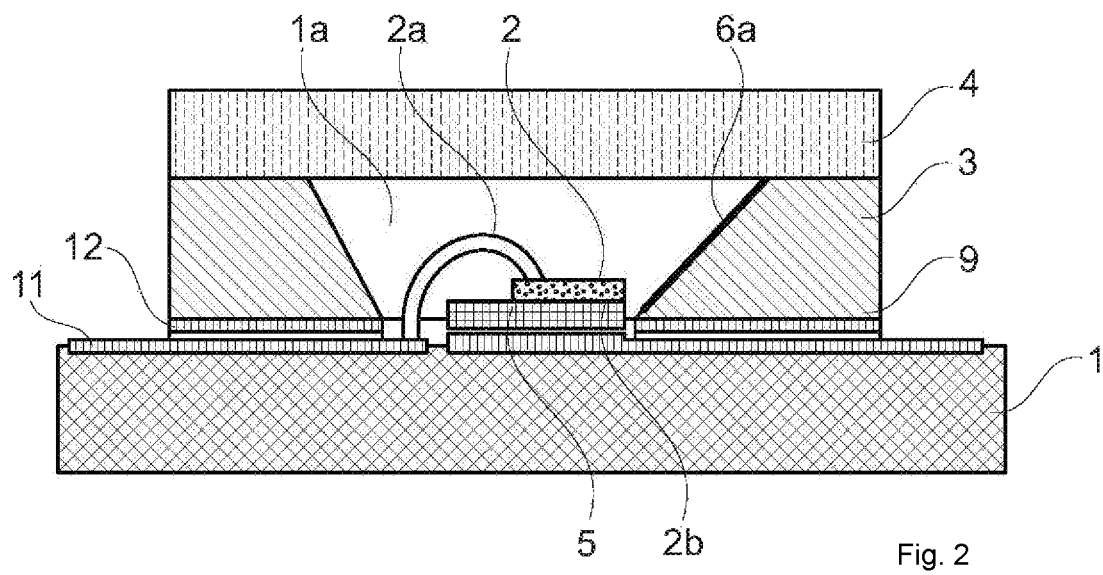
FIG. 2 shows a component arrangement in which an optical component is arranged in an installation space and is connected to external contacts via a contact connection leading out laterally.

FIG. 2 shows the arrangement of the optical component 2 with a laterally realized contacting. Here, conductor traces 11 are applied to the carrier substrate 1 and are led outwards below the spacer 3. The spacer 3 and the realized contacting are separated from one another by an electrical insulation layer 12. This layer can consist of SiOx or silicon nitride, for example. The connection between cap and board or the insulation layer is established, for example, by a eutectic metal bond.

Figure 3:
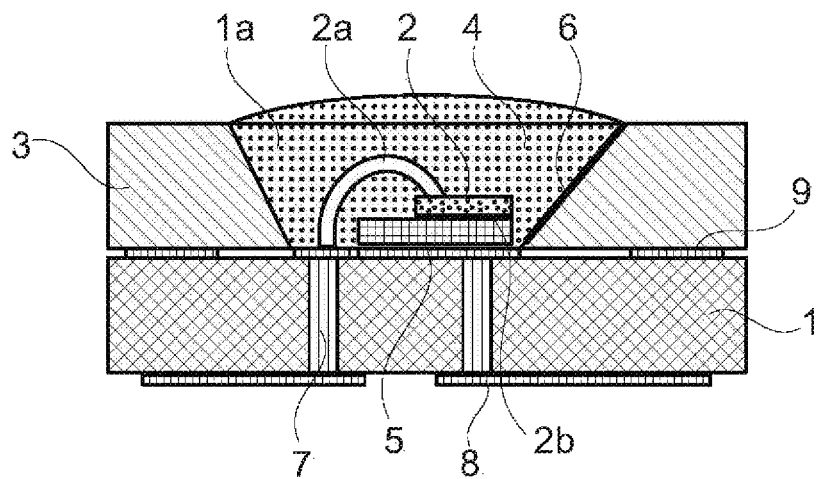
FIG. 3 shows a schematic representation of a component arrangement in which the installation space with the optical component is filled with a cover substrate.

FIG. 3 shows the component arrangement without the cover substrate 4. In this case, the installation space 1a is filled, for example, with an epoxy resin or silicone and is quasi-hermetic. This arrangement can be used, for example, with short-pulsed lasers. The connection to the carrier substrate can also be made by adhesive bonding.

Figure 4:
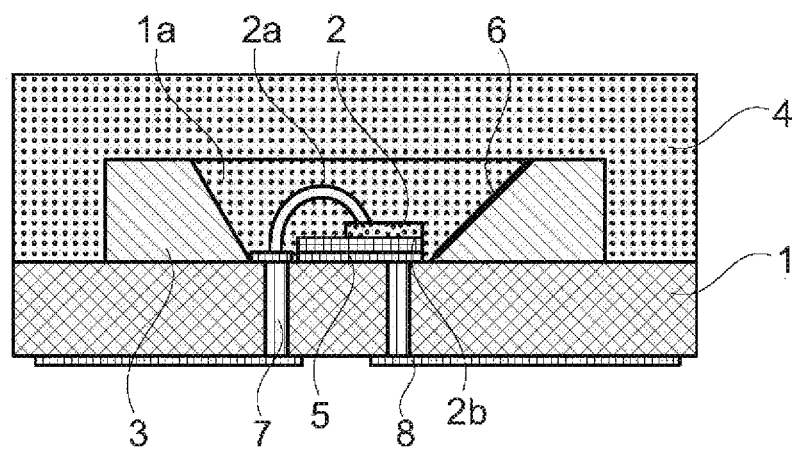
FIG. 4 shows a schematic representation of a component arrangement in which a cladding is formed with the cover substrate, with which the installation space with the optical component is filled.

FIG. 4 also shows a component arrangement without a cover substrate. In this embodiment, not only is the installation space 1a filled, but the entire component is overmolded.

Figure 5:
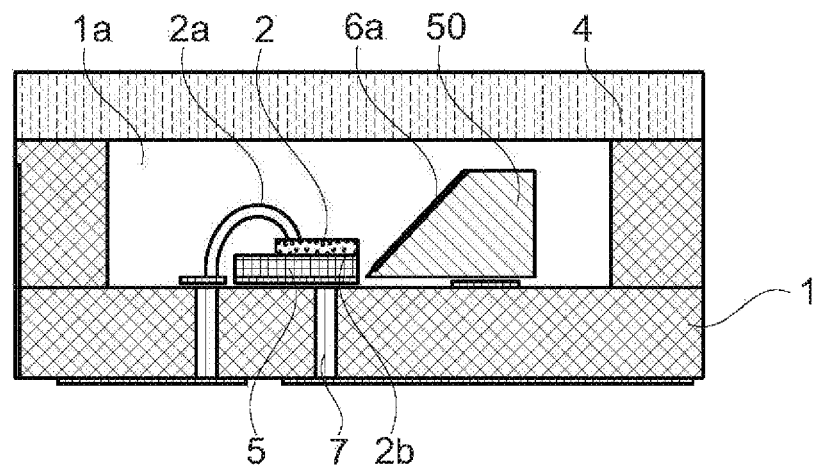
FIG. 5 shows a schematic representation of a component arrangement in which a light-reflecting surface is provided in the installation space by an anisotropically etched silicon component which is arranged in the installation space at a distance from a spacer.

FIG. 5 shows an arrangement of a side-emitting component in a ceramic package, for example. In this package, a single anisotropically etched silicon component 50 is provided in the installation space 1a for deflection of the beam and serves as a mirror element. This type of arrangement can also be provided for classic TO housings.

Figure 6:
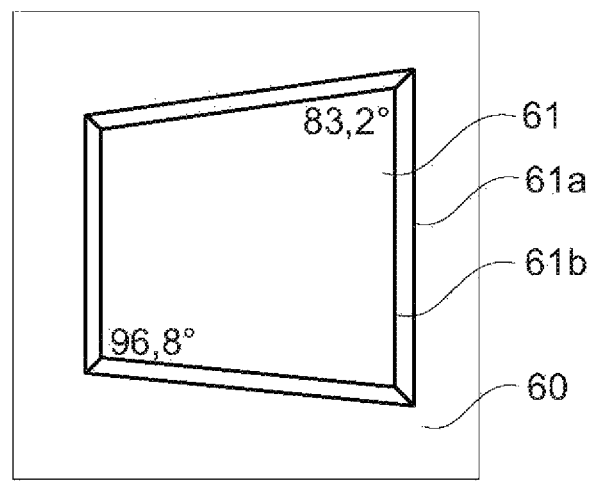
FIG. 6 shows a schematic representation of a spacer formed as a frame, which spacer is formed by an anisotropically etched silicon component.

FIG. 6 shows a plan view of the anisotropically etched structure of a mirror frame 60. A passage 61 in the silicon resulting from the inclination of the crystal is trapezoidal, both in the region of an upper opening 61a and in the region of a lower opening 61b, and axially symmetrical in one direction. The corner angles on the longer side with the 45-degree mirror plane are approximately 83.2 degrees each. On the opposite shorter side, the angles are approximately 96.8 degrees each. Edges of the upper and lower openings 61a, 61b run parallel to each other in pairs.

Figure 7A:
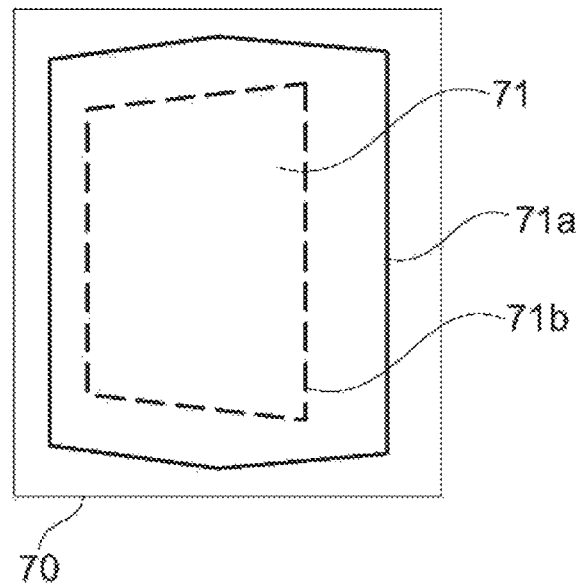
FIG. 7a shows a plan view from a light microscope of an etched frame structure in which a masking opening is selected for an anisotropic wet chemical etching process with a compensation structure.

FIG. 7a shows a plan view of an anisotropically etched structure of a mirror frame 70. In this case, a masking opening for the anisotropic etching process is not chosen along the trapezoidal 111 crystal planes (see FIG. 6), but is formed with a compensation structure. As a result, at the passage 71, the upper opening 71a of the etch pit (in contrast to the lower opening 71b) is not completely trapezoidal in comparison to FIG. 6, but is limited in one direction of its extent. In this way, it is possible to reduce the lateral dimension of the passage 71 and thus to arrange a larger number of etched structures on the silicon substrate. Depending on the application, different compensation structures can be provided.

Figure 7B:
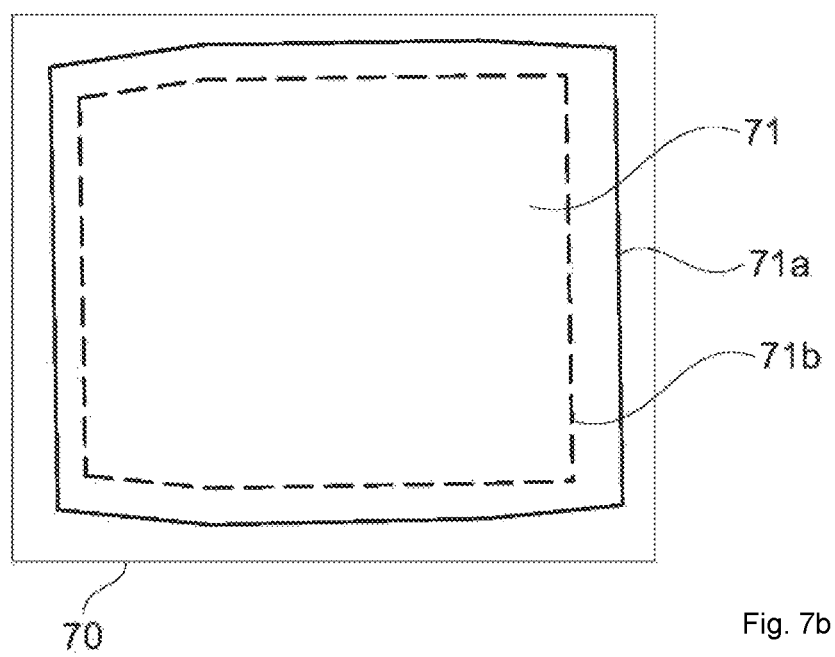
FIG. 7b shows a plan view from a light microscope of a further etched frame structure in which a masking opening is selected for an anisotropic wet chemical etching process with a compensation structure.

FIG. 7b shows a plan view of another anisotropically etched structure of a mirror frame 70. For the same features, the same reference signs are used in FIG. 7b as in FIG. 7a. The representation is based on a design of the etched silicon component in which the size and shape of the masking opening are selected in such a way that, for the lower opening 71b (as well as for the upper opening 71a), the trapezoid formed does not extend over the entire width of the passage 71, but substantially over a width of at least ⅔ of the total width of the passage. In this case, due to the inclined crystal, it is not possible to produce completely straight sides (i.e., without any buckling regions-continuous trapezoidal shape) of the upper and also the lower opening 71a, 71b by the etching process. To form parallel edges in the region of the upper and lower openings 71a, 71b (see FIG. 6), it is possible to provide a post-processing. With suitable substrate thicknesses, the number of etched structures on the silicon wafer can be further increased for certain lateral opening sizes of the masking.

Figure 8:
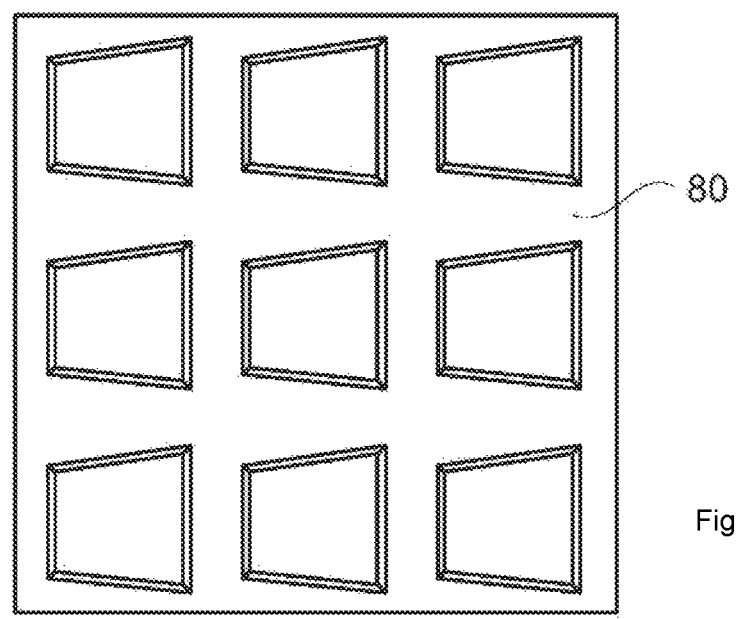
FIG. 8 shows a schematic representation of a section of a wafer having a plurality of openings, each of which can be used to form a component arrangement in order to produce a cap array.

FIG. 8 shows an arrangement of a plurality of openings in the form of an array 80. As a result of this arrangement, a plurality of components can be encapsulated simultaneously in the panel, thus saving space and, for example, increasing the light yield of the component arrangement. This is particularly advantageous for systems with a high light output. The array 80 can be designed as a panel solely consisting of spacers 3 with a 45-degree mirror surface or in combination with a cover substrate as a panel of encapsulations with a 45-degree mirror surface.

Figure 9:
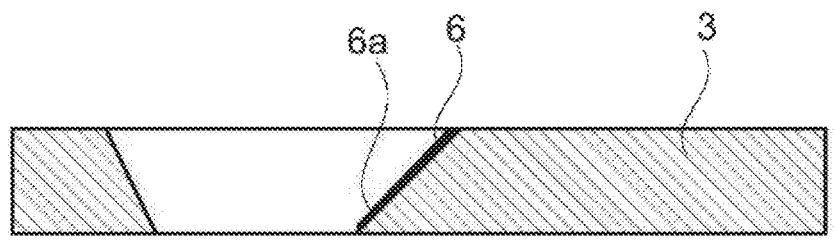
FIG. 9 shows a schematic representation of spacers, each formed with an anisotropically etched silicon component, wherein a central positioning of mirror surfaces in a frame geometry allows a central exit/entry of light.

FIG. 9 shows a circumferential spacer 3, which is designed as an anisotropically etched silicon component with a 45-degree mirror surface. In this embodiment, the spacer 3 is designed in such a way that a light beam can exit or enter the package centrally ("center emission"). Such spacers 3 can also be designed with a cover substrate as encapsulation (cf. FIG. 10).

Figure 10:
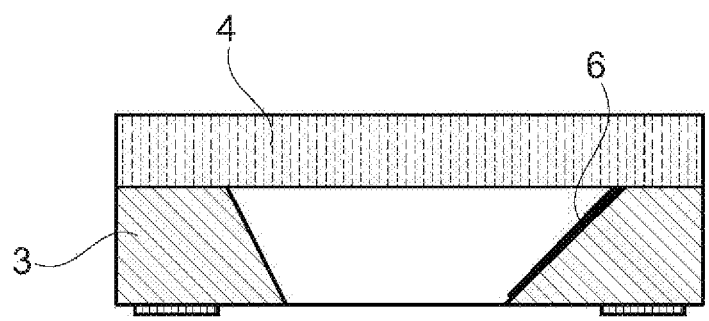
FIG. 10 shows a schematic representation of an arrangement comprising a spacer formed by an anisotropically etched silicon component, on which a cover substrate is arranged, the spacer having a rear-side, structured bonding surface, for example, a metallization, on an underside.

FIG. 10 shows a semi-finished product consisting of a spacer 3, which is designed as an anisotropically etched silicon component with a 45-degree mirror surface and a cover substrate. For joining to a carrier substrate 1, a structured bonding surface can be provided, for example a metallization. Different embodiments of this arrangement and corresponding methods for connecting a spacer 3 and a carrier substrate 1 are described in the embodiments for FIG. 1. This applies analogously to the joining of a spacer 3 and a cover substrate.

Figure 11:
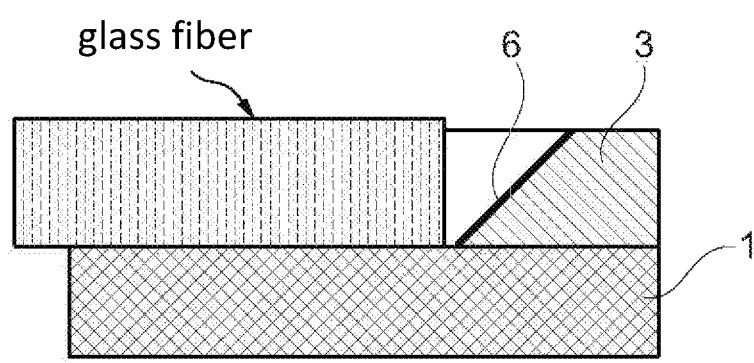
FIG. 11 shows a schematic representation of an arrangement in which a portion of a glass fiber is arranged opposite the light-reflecting surface for coupling/uncoupling light.

FIG. 11 shows an arrangement in which a silicon element with a 45-degree mirror surface is used for coupling a waveguide, for example a glass fiber. In this way, light can be uncoupled from the package or coupled into another waveguide (redirection of a signal).

Figure 12:
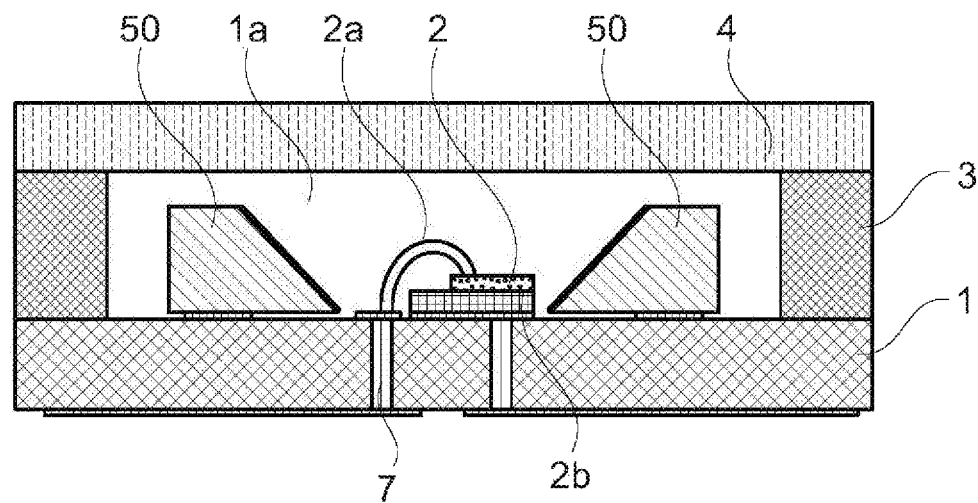
FIG. 12 shows a schematic representation of an arrangement in which two individual mirror elements are arranged in a housing.

FIG. 12 shows an arrangement of a side-emitting component, for example a laser diode or an LED, for example in a ceramic package. In comparison to FIG. 5, in this embodiment the placement of a plurality of silicon elements with 45-degree mirror surfaces is provided. This is advantageous if the side-emitting component emits light laterally in a number of directions. Laterally emitting light beams in one direction can also be provided, for example, to calibrate the laser diode via another monitor photodiode installed in the package.

Figure 13:
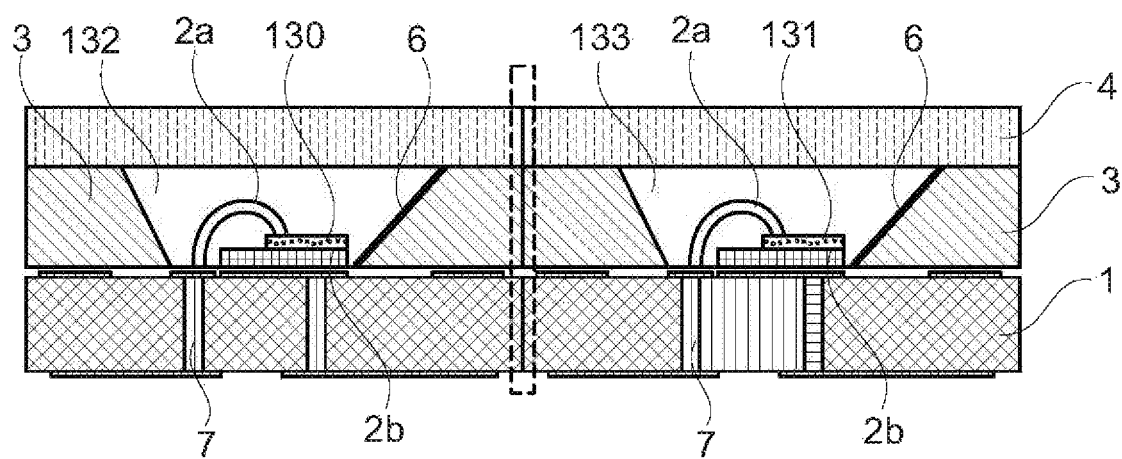
FIG. 13 shows a schematic representation of two components that have been manufactured in a panel or by wafer-level packaging.

FIG. 13 shows an arrangement, in which components 130, 131 are arranged in adjacent and separately formed installation spaces 132, 133. In this embodiment, the components 130, 131 are packaged at wafer level. For this purpose, a carrier substrate made of silicon, for example, can be provided. The silicon carrier substrate 1 is prepared with through contacts 7. The through contacts 7 can be realized, for example, by dry or wet etching with subsequent metal filling of the holes by an electroplating process. In addition, contacts for a component are provided on a front side of the carrier substrate and contacts for later mounting in SMD technology are provided on the rear side. For the electrical insulation of the through contacts, it can be provided that the carrier substrate 1 made of silicon is passivated by an inorganic layer prior to the electroplating and the generation of the contacts. For this purpose, a thermal oxidation of the silicon, the deposition, for example, of a nitride layer in an LPCVD process or other CVD processes (e.g. PECVD-plasma-enhanced CVD) for the deposition of insulation layers is conceivable. Prior to the electroplating of the metal filling of the through contacts, an electrically conductive seed layer must be applied to the previously deposited passivation layer. This can be done by sputtering processes, for example.

In this embodiment, a large number of components are first mounted serially on a prepared carrier substrate 1, which can be present in the form of a wafer or a rectangular panel, and are then joined in a further step by applying a cap wafer or cap array at wafer level or as a panel. In this way, a large number of encapsulated components are formed simultaneously. The individual packages are then provided when the composite is separated.

Figure 14:
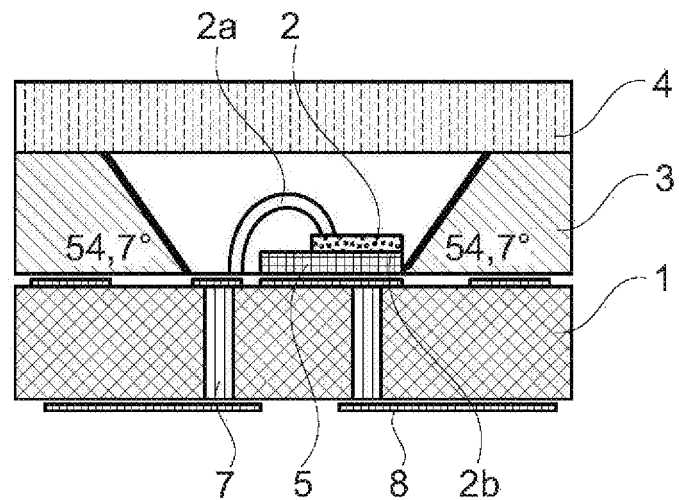
FIG. 14 shows a schematic representation of an arrangement in which the installation space is formed by a spacer element which has a flank angle of the mirror surfaces of approximately 54.7 degrees.

FIG. 14 shows an arrangement, in which the spacer 3 has been produced by anisotropic wet chemical etching from silicon of a single crystal not inclined to the 100 orientation. As a result, the 111 crystal planes are all formed with an angle of about 54.7 degrees. In this embodiment, the upward light emission from the package in a number of directions is favored. As previously described in FIG. 13, the production can also be represented as a packaging by wafer-level packaging.

Figure 15:
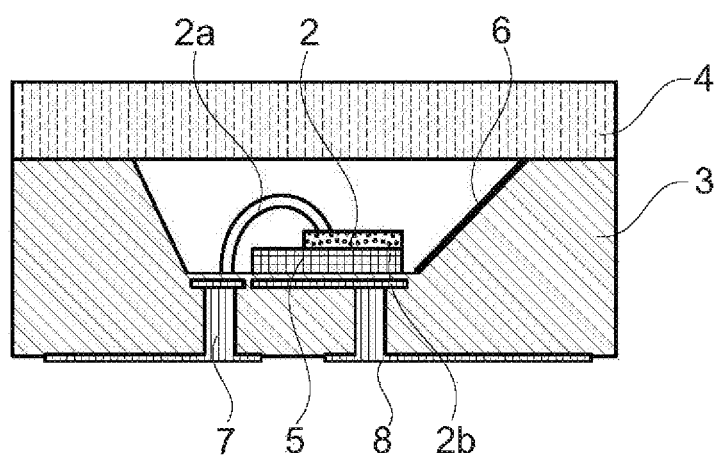
FIG. 15 shows a schematic representation of a component in which the spacer element and the carrier substrate are made in one piece and the through contacts are provided by a dry etching process.

FIG. 15 shows an arrangement in which the spacer 3 and the carrier substrate 1 are completely made in one piece of silicon. In this method, a cavity is etched into the silicon substrate on the front side by anisotropic wet chemical structuring. This cavity is connected on the rear side to dry-etched through contacts. The silicon substrate 1 is electrically insulated as described for FIG. 13.

Figure 16:
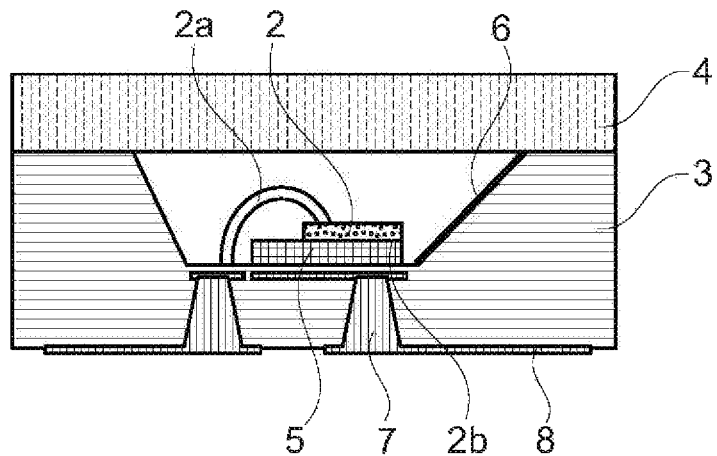
FIG. 16 shows a schematic representation of a component in which the spacer element and the carrier substrate are made in one piece and the through contacts are provided by a wet chemical etching process.

FIG. 16 shows an arrangement in which the spacer 3 and the carrier substrate 1 are completely made in one piece of silicon. In this method, a cavity is etched into the silicon substrate on the front side by anisotropic wet-chemical structuring. This cavity is connected on the rear side with through contacts 7, which are produced by anisotropic wet chemical etching in contrast to FIG. 15. The silicon substrate 1 is electrically insulated as described in FIG. 13.

Figure 17:
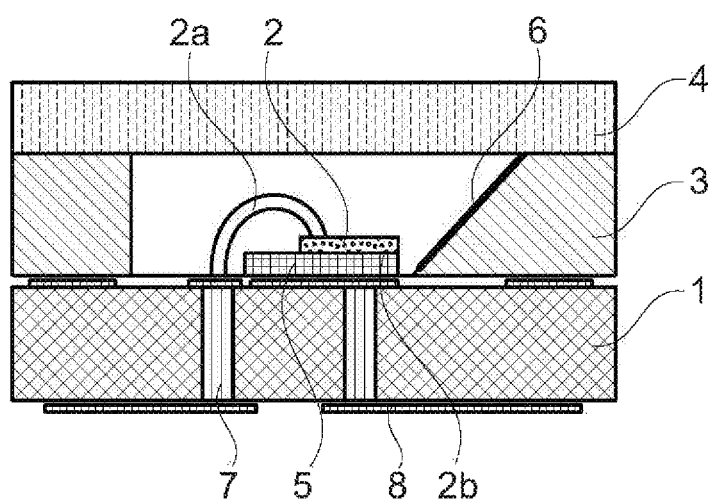
FIG. 17 shows a schematic representation of a component in which the walls of the installation space are approximately vertical with the exception of a 45-degree mirror plane.

FIG. 17 shows an arrangement in which the installation space has first been etched approximately vertically using dry etching methods. In a subsequent wet-chemical anisotropic etching step, a 45-degree surface is then formed which can be used as a mirror plane. The advantage of this design is that the area coverage on a substrate can be further increased by combining different etching methods.

Figure 18:
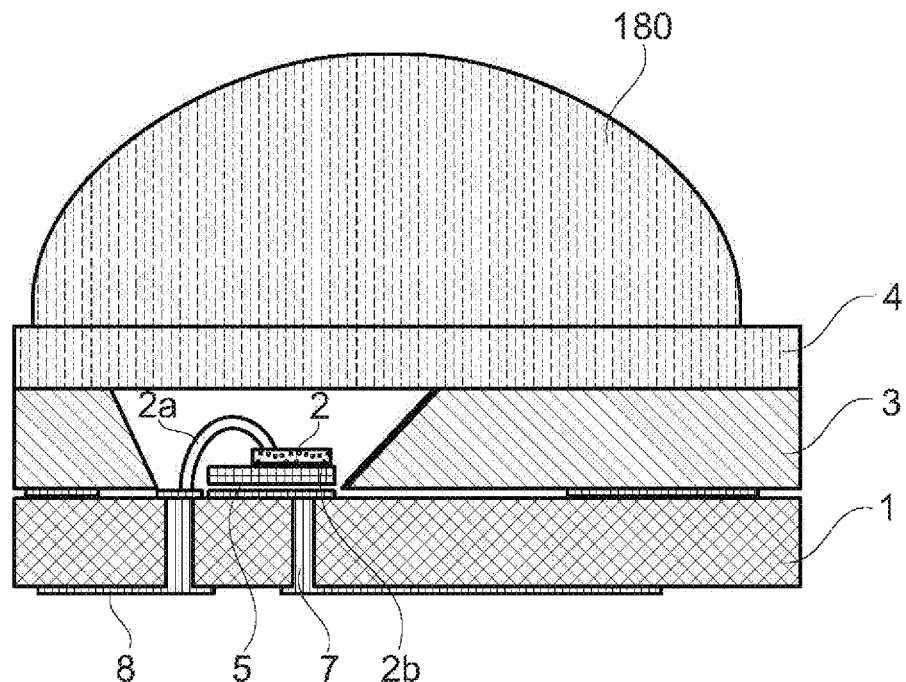
FIG. 18 shows a schematic representation of a component arrangement, in which a lens is arranged on the cover substrate.

FIG. 18 shows a component on which a lens arrangement 180 is additionally arranged on the cover substrate 4. This embodiment is described in greater detail in conjunction with FIG. 1.

Figure 19:
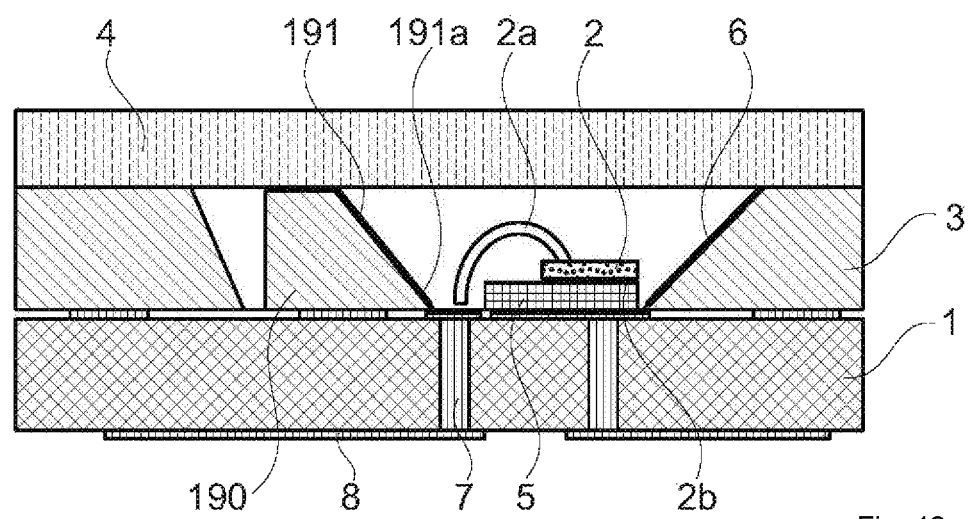
FIG. 19 shows a schematic representation of a component arrangement with a circumferential spacer element with mirror plane in combination with a single mirror element.

FIG. 19 shows a schematic representation of a component arrangement in which a mirror plane of 45 degrees is provided on the circumferential spacer 3 (silicon frame). A further element 190, which is designed as an anisotropically etched silicon component, with an inclined face 191 of likewise 45 degrees, is arranged on the carrier substrate 1 before the cap is mounted on it. With the inclined face 191, a light-reflecting surface is provided which has a mirror coating 191a in the embodiment shown.

FIG. 20 shows a schematic representation of a component arrangement, in which a lower opening 200 in the spacer 3, which is designed as an anisotropically etched silicon component, is designed with a chamfer 201, which is substantially vertically oriented in the example shown. On the one hand, this has the advantage of reducing the installation space 1a and thus the overall size of the package, and on the other hand, it allows a side-emitting component to be arranged closer to the light-reflecting mirror surface. This favors the impact of a light beam widened by possible beam divergence on the provided mirror surface. In this way, light exiting laterally from the component can be guided out of the installation space 1a even more efficiently and the component height can be reduced further still. In this embodiment, the chamfer 201 at the lower opening 200 of the spacer 3, for example, is realized by a dry etching process. However, it can also be provided to achieve the chamfer 201 by wet chemical overetching of the spacer 3, since in the anisotropic etching process, substantially vertical crystal planes in relation to the 100 orientation are achieved at convex edges of the silicon spacer 3.

FIG. 21 shows a schematic representation of a component arrangement in which a lower opening 210 in the spacer 3, which is designed as an anisotropically etched silicon component, is designed with an undercut 211 relative to the surface of the spacer 3. This offers the same advantages as already described for FIG. 20. The undercut 211, on the one hand, can be achieved as designed in FIG. 20 by suitable dry etching processes, and, on the other hand, a wet chemical anisotropic etching of the rear side of the spacer 3 is provided, with the opening and thus the undercut 211 being predetermined by a corresponding masking.

Although the invention has been illustrated and described in greater detail with reference to the preferred exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

The invention claimed is:

1. A component arrangement, comprising:
    a carrier substrate;
    a spacer which is arranged on the carrier substrate so as to surround an installation space and has an outlet opening on a side facing away from the carrier substrate;
    an optical component arranged in the installation space;
    a contact connection which electrically conductively connects the optical component to external contacts arranged outside the installation space;
    a cover substrate which is arranged on the spacer and with which the outlet opening is covered in a light-permeable manner; and
    a light-reflecting surface which is formed on an anisotropically etched silicon component and is arranged in the installation space as an inclined surface at an angle of approximately 45° relative to a surface of the carrier substrate facing the installation space, in such a way that light radiated in a horizontal direction onto the light-reflecting surface can be radiated out in a vertical direction through the opening and the cover substrate, and vice versa, wherein the spacer is formed from the anisotropically etched silicon component;
    wherein the outlet opening has, in plan view, an opening with a trapezoidal shape;
    wherein the anisotropically etched silicon component, in a plan view, has a lower opening with a trapezoidal shape and an upper opening with a trapezoidal shape that is limited in one direction of its extent.

2. The component arrangement according to claim 1, wherein the cover substrate at least partially fills the installation space.

3. The component arrangement according to claim 1, wherein the light-reflecting surface has a surface-side mirror coating.

4. The component arrangement according to claim 1, wherein the optical component has a lateral optical outlet/inlet, through which light can exit or enter in the horizontal direction.

5. The component arrangement according to claim 1, wherein the optical component is arranged on a submount which is arranged on the carrier substrate.

6. The component arrangement according to claim 1, wherein a first wall surface of the spacer, which faces the installation space and is arranged outside a region with the light-reflecting surface, is inclined relative to the vertical direction at a first angle different from 45°.

7. The component arrangement according to claim 6, wherein a second wall surface of the spacer, which is different from the first wall surface, faces the installation space and is arranged outside the region with the light-reflecting surface, is inclined relative to the vertical direction at a second angle different from 45°, which is different from the first angle.

8. A method, comprising:
producing the anisotropically etched silicon component from a silicon single crystal by anisotropic etching, wherein the silicon single crystal is inclined by approximately 9.7° to the 100 crystal orientation, such that a 111 crystal plane with a slope of approximately 45° is formed, and, in plan view, the opening with a trapezoidal shape is formed; and
producing the component arrangement according to claim 1 using the anisotropically etched silicon component, wherein the light-reflecting surface is formed in the component arrangement with the 111 crystal plane with the slope of approximately 45 °.

9. A method for producing a package according to claim 8, wherein the package is produced by means of wafer-level packaging.

* * * * *